US006586998B2

(12) United States Patent
Moraveji (10) Patent No.: US 6,586,998 B2
(45) Date of Patent: Jul. 1, 2003

(54) OUTPUT STAGE AND METHOD OF ENHANCING OUTPUT GAIN

(75) Inventor: Farhood Moraveji, Saratoga, CA (US)

(73) Assignee: Micrel, Incorporated, San Jose, CA (US)

(*) Notice: Subject to any disclaimer, the term of this patent is extended or adjusted under 35 U.S.C. 154(b) by 0 days.

(21) Appl. No.: 09/797,798

(22) Filed: Mar. 2, 2001

(65) Prior Publication Data

US 2002/0121934 A1 Sep. 5, 2002

(51) Int. Cl.[7] .................................................. H03F 3/18
(52) U.S. Cl. ........................................ 330/267; 330/263
(58) Field of Search ............................... 330/255, 263, 330/266, 267, 268; 327/321, 322, 309

(56) References Cited

U.S. PATENT DOCUMENTS

| | | | | |
|---|---|---|---|---|
| 5,512,859 A | * | 4/1996 | Moraveji | 330/267 |
| 5,515,007 A | * | 5/1996 | Moraveji | 330/263 |
| 5,614,866 A | * | 3/1997 | Dow | 330/263 |
| 5,786,731 A | * | 7/1998 | Bales | 330/265 |
| 5,917,378 A | * | 6/1999 | Juang | 330/255 |
| 5,973,563 A | * | 10/1999 | Seven | 330/265 |
| 6,160,451 A | * | 12/2000 | Floru | 330/263 |
| 6,297,699 B1 | * | 10/2001 | Murray et al. | 330/267 |

* cited by examiner

Primary Examiner—Robert Pascal
Assistant Examiner—Khanh Van Nguyen
(74) Attorney, Agent, or Firm—Dorsey & Whitney LLP (57) ABSTRACT

The present invention provides for an output stage which couples with an input stage and is configured to limit a reflection current which is reflected back into the input stage to enhanced an output voltage to drive a variety of loads. The present output stage limits the reflection current by compensating for at least one bias current at the input stage output. The output stage further reduced a quiescent current needed to maintain the output stage in an active state without adversely affecting the output voltage supplied to the load. The output stage includes a first and second current driving stage, a first and second current compensation circuit and an output circuit. The first and second current driving stages couple with both the input stage and the output circuit. The first and second current driving stages are configured to generate a first and second driving current, respectively, to drive the output circuit, wherein the first driving current is proportional to a first bias current and the second driving current is proportional to a second bias current. To limit reflection current the first current compensation circuit is configured to compensate for the first bias current while the second current compensation circuit is configured to compensate for the second bias current.

36 Claims, 6 Drawing Sheets

OUTPUT STAGE AND METHOD OF ENHANCING OUTPUT GAIN

FIELD

This invention pertains to an output stage, and more particularly to an output stage and method for preventing offset voltage error and improving output stability and performance.

BACKGROUND

It is known in the prior art to provide some degree of output stage control for amplifier outputs. However, prior art amplifier output stages have several limiting features which affect the amplification of the amplifier input signal and fail to provide adequate control of the amplifier output.

Figure 1:
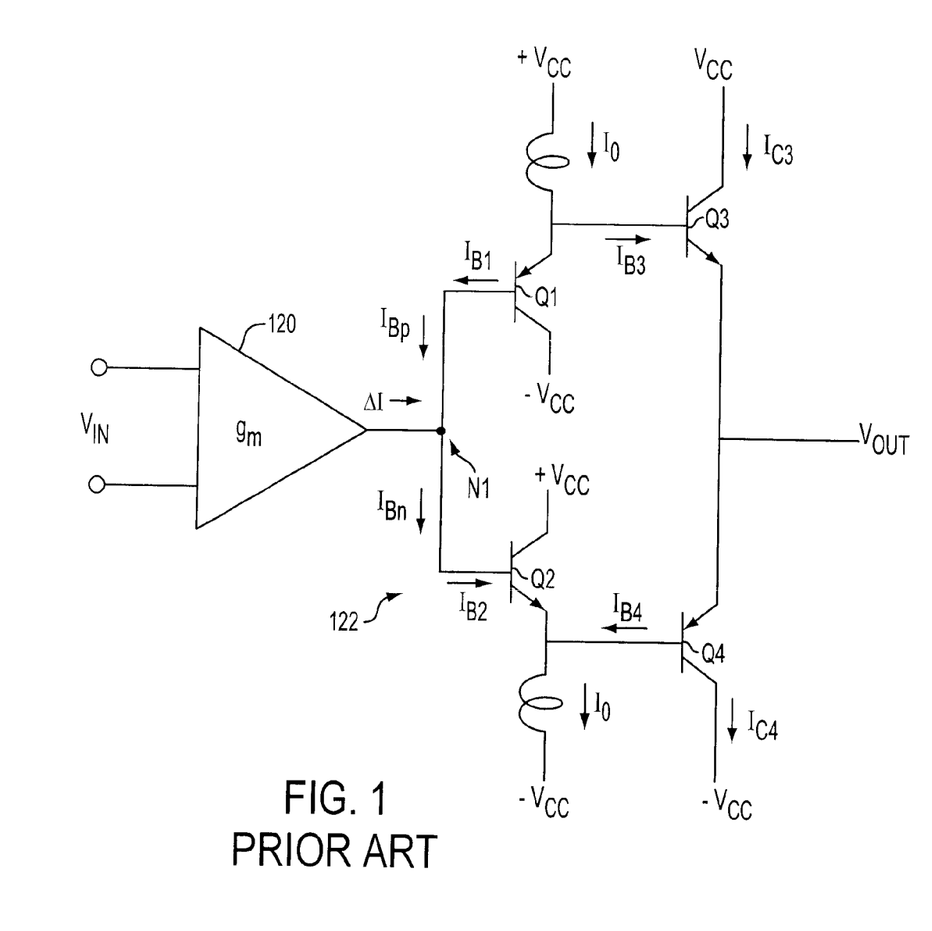
FIG. 1 depicts a prior art amplifier and amplifier output stage.

FIG. 1 depicts an example of a prior art amplifier 120 with an output stage 122. One of the problems with prior art amplifier output stages is that they cause an excessively large reflection current ($\Delta I$) to be reflected back into amplifier 120. The current reflection $\Delta I$ will be reflected back through transconductance amplifier 120 and produce a systematic input offset error voltage ($V_{OS}$) which can have significant effects on the performance of amplifier 120. The resulting offset error voltage $V_{OS}$ is equivalent to the reflection current $\Delta I$ divided by the amplifier transconductance ($g_m$), $V_{OS}=\Delta I/g_m$. Therefore, any increase in $\Delta I$ will result in an unwanted increase in offset error voltage $V_{OS}$.

In the prior art amplifier output stage 122, current $I_o$ provides the driving current to the base of a source NPN transistor Q3 which in turn controls the current flow through transistor Q3 and thus output voltage $V_{out}$. Because the base current $I_B$ of a transistor provides control for the collector current $I_C$ through the known beta factor relationship of $I_C=I_B*\beta$, $I_{B3}$ provides control for the collector current $I_{C3}$ of transistor Q3 and thus the output voltage $V_{out}$. Therefore, to achieve a sufficiently large output voltage, $V_{out}$, through transistor Q3, base current $I_{B3}$ of transistor Q3 must be sufficiently large to drive $I_{C3}$. To achieve a sufficiently large $I_{B3}$, the base current of transistor Q1 ($I_{B1}$) must be sufficiently large (again, $I_C=I_B*\beta$) to generate a sufficiently large $I_o$ current to drive transistor Q3.

This large base current $I_{B1}$ causes a significant increase in the current at node N1. This increase at node N1 results in an increase in reflection current $\Delta I$. The resulting increased $\Delta I$ is reflected back through transconductance amplifier 120 resulting in an increased offset error voltage $V_{OS}$ which in turn affects the overall amplifier output voltage $V_{out}$, depending on the closed-loop gain.

A similar analysis can be made with regard to driving transistor Q2 which drives sink output transistor Q4. To achieve a sufficiently large output current through transistor Q4, a base current ($I_{B4}$) of transistor Q4 must be sufficiently large to produce a sufficiently large collector current ($I_{C4}$) for transistor Q4. Therefore, $I_o$ through driving transistor Q2 must be sufficient to drive sink output transistor Q4. This requires an increase in base current ($I_{B2}$) for transistor Q2 which in turn affects the current at node N1.

The prior art output stage 122 further affects the overall amplifier output voltage $V_{out}$ because of the needed implementation of Q1 as a fast PNP transistor. To achieve a desired bandwidth and efficiency, Q1 needs to be a fast transistor. Therefore, the Q1 transistor is implemented with a vertical PNP configuration to improve response time. However, fast, vertical PNP transistors have a reduced $\beta$, which in turn reduces the driving current $I_o$. Thus, to maintain $I_o$ at a sufficiently large level to drive source transistor Q3, $I_{B1}$ must be further increased. The further increase to $I_{B1}$ causes an increase in the current at node N1, resulting in an increase in reflection current $\Delta I$ and thus an increase in offset error voltage $V_{OS}$.

What is needed is an amplifier output stage which provides a sufficiently large driving current to the base of a source transistor without adversely increasing the reflection current $\Delta I$. What is further needed is an output stage which will significantly reduce or eliminate any reflection current $\Delta I$, where $\Delta I$ is due to a mismatch of beta factors of NPN transistors ($\beta_{npn}$) and PNP transistors ($\beta_{pnp}$).

SUMMARY

The present invention provides for an output stage which couples with an input stage and is configured to limit a reflection current which is reflected back through the input stage producing an offset error input voltage affecting the performance of the input stage. The present output stage limits the reflection current by compensating for at least one bias current at the input stage output. The output stage further reduces a quiescent current needed to maintain the output stage in an active state without adversely affecting the output voltage supplied to the load. The output stage includes a first and second current driving stage, a first and second current compensation circuit and an output circuit. The first and second current driving stages couple with both the input stage and the output circuit. The first current driving stage is configured to generate a first driving current to drive the output circuit, wherein the first driving current is proportional to a first bias current based on an output from the input stage. The second driving stage is configured to generate a second driving current to also drive the output circuit, wherein the second driving current is proportional to a second bias current based on the output of the input stage. To limit reflection current back into the input stage, the first current compensation circuit couples with the first driving stage and the input stage, and is configured to compensate for the first bias current. To further limit the reflection current back into the input stage, the second current compensation circuit couples with the second driving stage and the input stage, and is configured to compensate for the second bias current.

In one embodiment, the first current driving stage further includes a first current multiplier coupled with the output circuit, and is configured to drive the output circuit at a sufficient level while limiting the first bias current. The second current driving stage further includes a second current multiplier coupled with the output circuit, and is configured to drive the output circuit at a defined level while limiting the second bias current. The first current compensation circuit includes a first current mirror coupled with the first current driving stage to compensate for the first bias current and the second current compensation circuit includes a second current mirror coupled with the second current driving stage to compensate for the first bias current. The output stage further includes a clamping stage coupled with the input stage and the output circuit, and a feedforward path coupled between the input stage and the output circuit. The clamping stage is configured to maintain the output level of the output stage to be approximately equal to the input stage output, while the feedforward path is configured to stabilize the output stage output at high frequencies.

In one embodiment, the first current compensation circuit further includes a PNP sink transistor coupled with the first current driving stage to sink a first driving stage total collector current from the first current driving stage. The PNP sink transistor is configured to define a first compensation current to compensate for the first bias current wherein the first bias current is about equal to a total collector current of the first current driving stage divided by a PNP beta factor. Further, the second current compensation circuit includes an NPN source transistor coupled with the second current driving stage to supply a second driving stage total collector current from the second current driving stage. The NPN source transistor is configured to define a second compensation current to compensate for the second bias current wherein the second bias current is about equal to a total collector current of the second current driving stage divided by an NPN beta factor.

In accordance with the teachings of this invention a novel method and structure is taught which provides integration, access, and transportation software data and information networks capable of delivering adaptable, expandable, high volume, high performance, and fault tolerant capabilities.

BRIEF DESCRIPTION OF THE DRAWINGS

The invention, together with further advantages thereof, may best be understood by reference to the following description taken in conjunction with the accompanying drawings in which.

DETAILED DESCRIPTION

Figure 2:
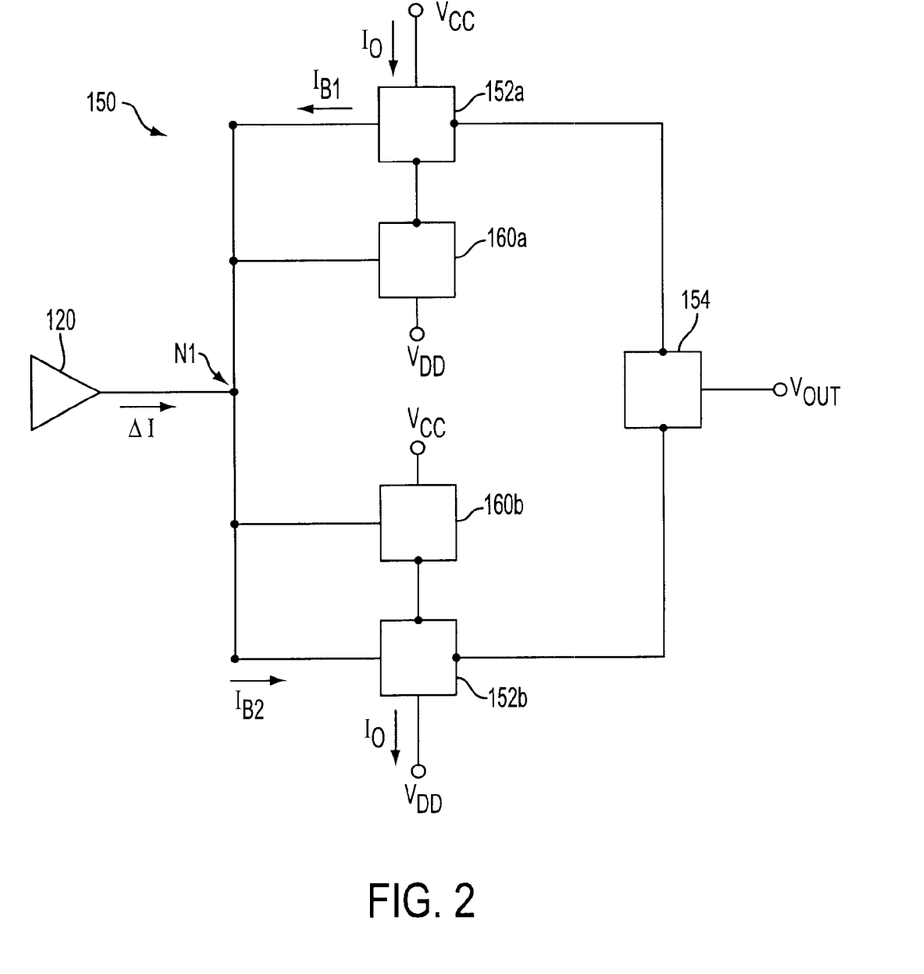
FIG. 2 is a block diagram of one embodiment of an output stage of the present invention.

FIG. 2 depicts a block diagram of one embodiment of the present novel output stage 150. Output stage 150 provides for an output voltage $V_{out}$ while substantially eliminating reflection current $\Delta I$ from reflecting back into substantially any input stage circuit where reflection current has an adverse effect. In the embodiment shown in FIG. 2, output stage 150 substantially eliminates reflection current $\Delta I$ from reflecting back into an amplifier input stage 120 substantially eliminating a systematic input offset voltage which is caused by the reflection current. The reduction or elimination of reflection current $\Delta I$ is achieved by offsetting base currents for first and second current driving stages 152a and 152b, and further by reducing the amount or size of driving current $I_o$. As shown in FIG. 2, amplifier input stage 120 is coupled to output stage 150. Output stage 150 includes first and second driving stages 152a–b coupled with amplifier 120 at node N1. First and second driving stages 152a–b couple with and drive an output circuit 154 of output stage 150. First and second driving stages 152a–b reduce the current at node N1, and thus the reflection current $\Delta I$ which reflects back into amplifier input stage 120, by reducing the size of the driving current $I_o$, as is described in more detail below. Refection current $\Delta I$ is further reduced by compensating for bias currents applied to or from driving stages 152a–b through current compensation circuits 160a–b, as is described more fully below.

In one embodiment, to improve bandwidth and speed of the system, first driving circuit 152a is at least partially implemented utilizing vertical PNP transistors while the second driving circuit 152b is at least partially implemented utilizing NPN transistors. Thus, in one embodiment, the beta factor $\beta_{pnp}$ for first driving circuit 152a will not equal the beta factor $\beta_{npn}$ for the second driving circuit. This mismatch of beta factors results in a mismatch in bias currents $I_{B1}$ and $I_{B2}$ resulting in a reflection current $\Delta I$. To compensate for this mismatch, reflection current $\Delta I$ is further reduced by compensating for bias currents $I_{B1}$ and $I_{B2}$ into first and second driving stages 152a–b, respectively, through a first and second current compensation circuit 160a–b. First compensation circuit 160a couples with first driving circuit and node N1 to compensate for bias current $I_{B1}$ and second compensation circuit 160b couples with second driving circuit and node N1 to compensate for bias current $I_{B2}$. First current driving stage 152a and second compensation circuit 160b are coupled with a first voltage reference VCC, and second current driving stage 152b and first compensation circuit 160a further couple with a second voltage reference VDD.

Figure 3:
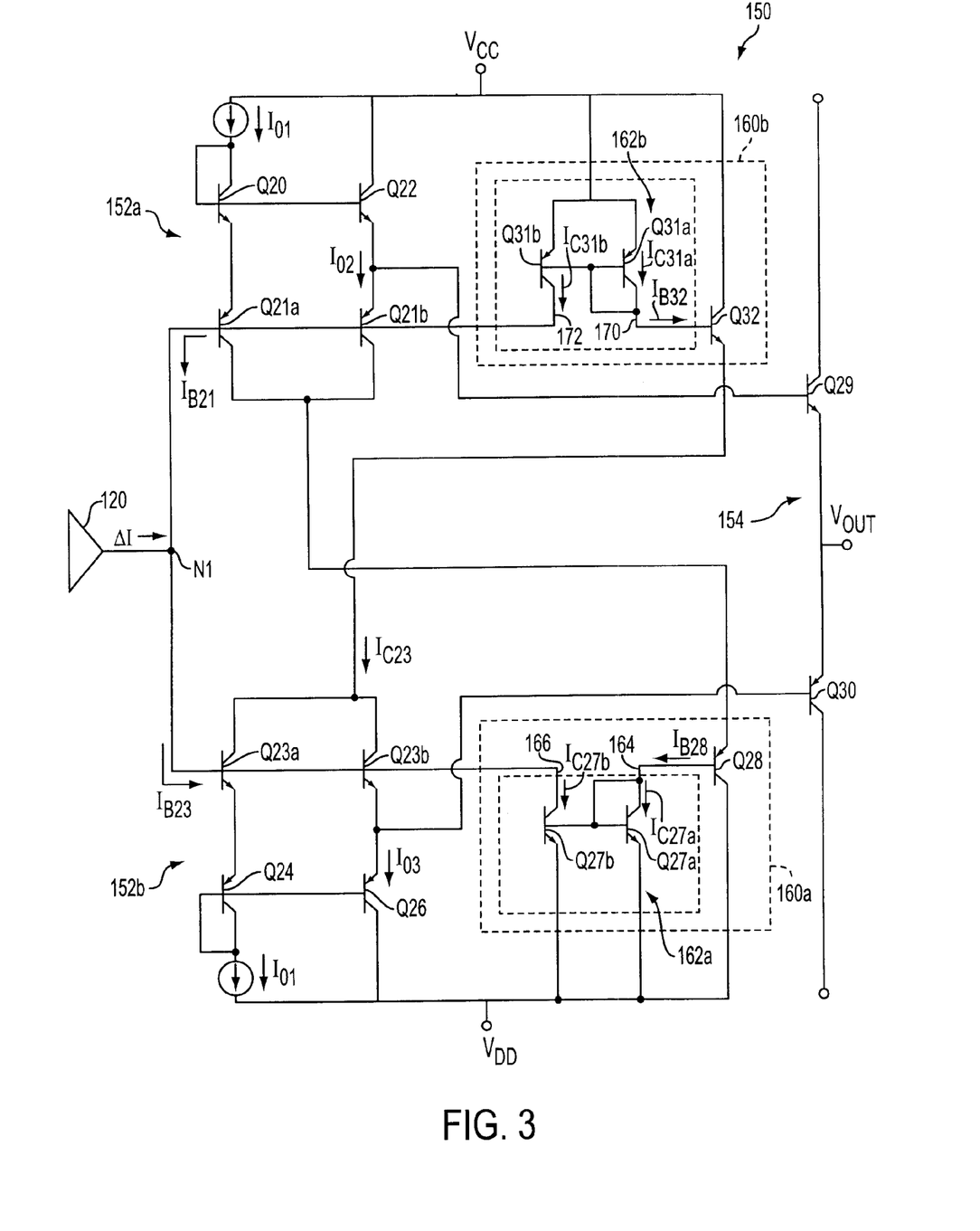
FIG. 3 is a schematic diagram of one embodiment of an output stage.

FIG. 3 depicts a simplified schematic diagram of amplifier input stage 120 coupled with one embodiment of an output stage 150 of the present invention. In one embodiment, the present invention reduces, and preferable eliminates, the offset error voltage $V_{OS}$ by compensating for the reflection current $\Delta I$ at the node N1. The reflection current $\Delta I$ is equal to the sum of the currents at node N1. Thus, reflection current $\Delta$ *is the sum of the bias or base currents* $I_{B21}$ and $I_{B23}$ of both the first and second driving stages 152a and 152b, respectively. Reflection current $\Delta$ *can be written as:*

$$\Delta I = I_{B21} - I_{B23}, \tag{eq. 1}$$

where base current $I_{B21}$ is the sum of the base currents $I_{B21a}$ and $I_{B21b}$ from transistors Q21a and Q21b, respectively, and base current $I_{B23}$ is the sum of the base currents $I_{B23a}$ and $I_{B23b}$ of transistors Q23a and Q23b, respectively. Therefore, to eliminate reflection current, one can design first and second driving stages to have equivalent base currents. Alternatively, reflection current $\Delta I$ can be eliminated by compensating for each base current individually.

Because the base current of a transistor is substantially equal to the collector current divided by the beta factor $\beta$ for that transistor, base current can be written as:

$$I_B = I_C / \beta. \tag{eq. 2}$$

Utilizing equation 2, equation 1 can be rewritten as:

$$\Delta I = (I_{C21}/\beta_{pnp}) - (I_{C23}/\beta_{npn}) \tag{eq. 3}$$

As described above, because the transistors Q21A and Q21B of one embodiment of first driving stage 152a are configured as fast, vertical PNP transistors to achieve the desired bandwidth and speed, the value of the beta factor $\beta_{pnp}$ of these PNP transistors will generally not match the $\beta_{npn}$ value of the NPN transistors Q23A and Q23B of second driving stage 152b. Therefore, base current $I_{B21}$ of first driving stage 152a will generally not equal base current $I_{B23}$ of second driving stage 152b, resulting in a current at node N1 producing reflection current $\Delta I = I_{B21} - I_{B23}$.

In one embodiment, to compensate for the mismatch in base currents $I_{B21}$ and $I_{B23}$, output stage 150 includes first and second current compensation circuits 160a and 160b. Each current compensation circuit includes a current mirror circuit 162a and 162b. First current mirror 162a further couples with the base of current sink transistor Q28 and receives the base current $I_{B28}$ from sink transistor Q28. Sink transistor Q28 is configured to receive the driving stage total collector current $I_{C21}$ from both transistors Q21a and Q21b of first driving stage 152a. Second current mirror 162b further couples with the base of current source transistor Q32 and supplies the base current to source transistor Q32. Source transistor Q32 is configured to supply the driving stage collector current $I_{C23}$ for both transistors Q23a and Q23b of second driving stage 152b.

Current mirrors 162a–b of output stage 150 are configured in any convenient manner, for example a pair of base coupled transistors, or two pairs of base coupled transistors in a stacked configuration, as is known in the art. Current mirrors 162a and 162b depicted in FIG. 3 are simple representations of current mirrors, however, either one or both can be configured in alternative configurations. First current mirror 162a includes a current control leg 164 and a current mirror output leg 166. In the embodiment depicted in FIG. 3, current control leg 164 includes current control transistor Q27a and current mirror output leg 166 includes current mirror output transistor Q27b. The base of control transistor Q27a and the base of mirror output transistor Q27b are both coupled with the collector of control transistor Q27a. Thus each have substantially the same base current ($I_{B27a}=I_{B27b}$) or base to emitter voltage drop $V_{BE}$. Because each transistor, Q27a and Q27b, has the same base current, each will have substantially the same collector current, $I_{C27a}=I_{C27b}$, provided that each transistor has substantially the same $\beta_{npn}$, which should be the case because both will be formed in substantially the same manner. Therefore, the current $I_{C27b}$ in current mirror output leg 166 will mirror of the current $I_{C27a}$ in control leg 164.

Second current mirror circuit 162b follows the same logic as described for first current mirror circuit 162a. Therefore, the current in current mirror output leg 172 mirrors the current in control leg 170.

Through current compensation circuits 160a and 160b, the mismatch between $I_{B21}$ and $I_{B23}$ is eliminated by providing a compensation current for each, thus reflection current ΔI is eliminated. First mirror circuit 162a is configured to compensates for base current $I_{B21}$ of transistors Q21a and Q21b, and second mirror circuit 162b is configured to compensate of base current $I_{B23}$ for transistors Q23a and Q23b. This is achieved by matching the first current mirror output $I_{C27b}$ of first mirror circuit 162a with base current $I_{B21}$ of transistors Q21a and Q21b($I_{B21}=I_{B21a}+I_{B21b}$), and matching the second current mirror output $I_{C31b}$ of second mirror circuit 162b with base current of transistors Q23a and Q23a($I_{B23}=I_{B23a}+I_{B23b}$).

Because source transistor Q32 supplies the collector current $I_{C23}$ to transistors Q23a and Q23b, $I_{C23}$ is substantially equal to collector current $I_{C32}$ of source transistor Q32. Thus, utilizing equation 2, $I_{B23}=I_{C23}/\beta_{npn}$, where $I_{C23}=I_{C23a}+I_{C23b}$, base current $I_{B23}$ is substantially equal to:

$$I_{B23}=I_{C32}/\beta_{npn}. \quad (eq.\ 4)$$

Again relying on equation 2, base current $I_{B32}$ of source transistor Q32 is substantially equal to $I_{C32}/\beta_{npn}$. Base current $I_{B32}$ of source transistor Q32 is supplied by, and substantially equal to, collector current $I_{C31a}$ of current control transistor Q31a. Because collector current $I_{C31b}$ of current mirror output transistor Q31b equals collector current $I_{C31a}$ of control transistor Q31a, control mirror output current $I_{C31b}$ equals:

$$I_{C31b}=I_{C32}/\beta_{npn}. \quad (eq.\ 5)$$

Combining equations 4 and 5 ($I_{B23}=I_{C32}/\beta_{npn}$, and $I_{B31b}=I_{C32}/\beta_{npn}$) results in:

$$I_{B23}=I_{C31b}. \quad (eq.\ 6)$$

Thus, second current compensation circuit 160b compensates for base current $I_{B23}$ of transistors Q23a and Q23b, and base current $I_{B32}$ of source transistor Q32 defines a first compensation current.

Following similar calculations as described for the compensation of bias current $I_{B23}$, bias current $I_{B21}$ is compensated by first current compensation circuit 160a. Utilizing equation 2, $I_{B21}=I_{C21}/\beta_{pnp}$. Because sink transistor Q28 receives the total collector current $I_{C21}$ from transistors Q21a and Q21b, total collector current $I_{C21}$ is substantially equal to collector current $I_{C28}$ of sink transistor Q28. Thus, base current $I_{B21}$ is substantially equal to:

$$I_{B21}=I_{C28}/\beta_{pnp}. \quad (eq.\ 7)$$

Again relying on equation 2, base current $I_{B28}$ of sink transistor Q28 is substantially equal to $I_{C28}/\beta_{pnp}$. Base current $I_{B28}$ supplies, and is substantially equal to, collector current $I_{C27a}$ of current control transistor Q27a. Because collector current $I_{C27a}$ of current mirror output transistor Q27b mirrors collector current $I_{C27a}$ of control transistor Q27a, control mirror output current $I_{C27b}$ is substantially equal to the collector current $I_{C27a}$ of current control transistor Q27b, therefore:

$$I_{C27a}=I_{C28}/\beta_{pnp}. \quad (eq.\ 8)$$

Combining equations 7 and 8 results in:

$$I_{B21}=I_{C27a}. \quad (eq.\ 9)$$

Thus, first current compensation circuit 160a compensates for base current $I_{B21}$ of transistors Q21a and Q21b, and base current $I_{B28}$ of sink transistor Q28 defines a second compensation current.

As such, first and second current compensation circuits 162a and 162b provide further current, $I_{C27b}$ and $I_{C31b}$, to node N1, thus equation 1 can be rewritten to as:

$$\Delta I=(I_{B21}-I_{C27b})-(I_{B23}-I_{C31b}), \quad (eq.\ 10)$$

and since $I_{B21}=I_{C27a}$ and $I_{B23}=I_{C31b}$, equation 10 results in ΔI=0. Therefore, resulting reflection current ΔI equals zero, and there is substantially no reflection current back into amplifier 120, thus eliminating offset error voltage $V_{OS}$.

The present output stage 150 further provides for temperature and processing compensation to ensure continuous and accurate reflection current ΔI reduction and/or elimination. As is known in the art, changes in temperature and changes in circuit processing can alter or affect the operation of transistors. As such, changes in temperature or processing can alter the base currents $I_{B21}$ and $I_{B23}$ due to the changes in β and the operation of transistors Q21 and Q23 which may result in an altered or changed reflection current ΔI. However, because of the design of the current compensation circuits 154a–b, changes in temperature or processing will also affect the transistors of current compensation circuits 154a–b. Thus, current compensation circuits of the present invention maintain accurate compensation bias currents regardless of variations in temperature and processing. Thus providing a superior and more stable amplifier output.

In one embodiment, the present invention provides output circuit 154 with a sufficient driving current to generate a stable and accurate output voltage $V_{out}$ while maintaining a quiescent current of first and second driving stages 152a–b at a reduced level. As was described with respect to the prior art output stages, a sufficiently large current is needed to drive the output transistors to obtain a sufficient output current. However, in prior art designs, large bias currents are needed to generate the sufficient driving current to drive the output transistors. This can result in greater variations between bias currents and thus a larger reflection current $\Delta I$ along with increased power consumption.

In one embodiment the present invention reduces the quiescent current or idle current needed to maintain transistors Q21 and Q23 of current driving stages 152a–b in an active state to prevent delays in forwarding the amplifier input stage output to the output circuit 154 without adversely affecting the level of the driving current at output circuit 154. Further, by reducing the idle current, the bias currents $I_{B21}$ and $I_{B23}$ are reduced thus reducing the level of compensation current needed to be generated by current compensation circuits 160a–b. This reduced quiescent current and reduced compensation currents $I_{C27b}$ and $I_{C31b}$ results in a reduction in the total power consumption of output stage 150.

Still referring to FIG. 3, in one embodiment, output stage 150 reduces the quiescent current needed for first and second driving stages 152a–b. Quiescent current or idle current is reduced by reducing the size of driving current $I_{o1}$. Output circuit 154 of output stage 150 must be driven by a sufficiently large driving current to generate an adequate output voltage $V_{out}$. However, a large driving current can adversely affect the reflection current back into amplifier 120 and requires a larger idle current to maintain transistors Q21 and Q23 in an active state to prevent delays as described above. Thus, in one embodiment, the driving current $I_{o1}$ is limited to reduce the total quiescent current. In one embodiment, this is achieved by multiplying driving current $I_{o1}$ through a current multiplier transistor Q22. Driving current $I_{o1}$ passes through a first driving transistor Q20. Driving current $I_{o1}$ drives the base current $I_{B22}$ of current multiplier transistor Q22 depending upon the magnitude of the output of amplifier input stage, thus multiplying driving current $I_{o1}$ to produce a first driving current $I_{o2}$ to feed output source NPN transistor Q29 at a sufficient level resulting in a sufficient output voltage $V_{out}$. Similarly, in the second driving stage 152b, driving current $I_{o1}$ from collector current of transistor Q24, is multiplied by multiplier transistor Q26 resulting in second driving current $I_{o3}$ to drive the base of output sink PNP transistor Q30 resulting in a sufficient output voltage $V_{out}$. By reducing the size of the driving current $I_{o1}$, the bias or base currents of transistors Q21a–b and Q23a–b are significantly reduced. Thus the idle current is reduced and the net current at node N1 is reduced. The reduced net current at node N1 results in a reduced reflection current $\Delta I$. Thus, the output stage 150 of the present invention reduces the idle current, the levels of compensation current needed and the overall power consumption by reducing the driving current $I_{o1}$. A similar analysis can be provided for second driving transistor Q24 and second current multiplier transistor Q26 resulting in reduced idle current.

Further, the drive current $I_{o1}$ is reduced in one embodiment without causing any further delay in the path between amplifier input stage 120 at node N1 to output circuit 154. The present invention includes only a single transistor delay between node N1 and output circuit 154. Thus, the present invention reduces driving current $I_{o1}$ and thus the quiescent currents without any additional delay in the propagation of the output of amplifier input stage 120 at node N1 to output circuit 154.

Figure 4:
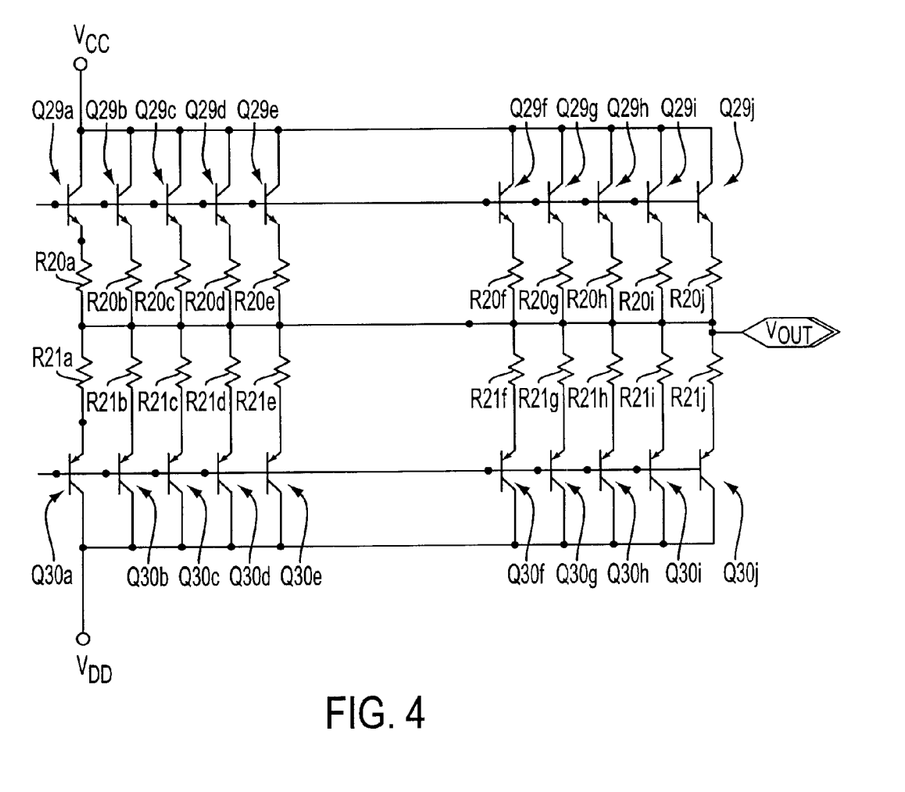
FIG. 4 depicts one embodiment of an output circuit which includes a plurality of source transistors and a plurality of sink transistors.

Referring to FIG. 4, output circuit 154 of the present invention is configured in any convenient manner to provide amplifier output stage 150 output voltage $V_{out}$. In one embodiment, output circuit 154 includes a plurality of output source transistors Q29 and a plurality of output sink transistors Q30. FIG. 4 depicts one embodiment of output circuit 154 which includes source transistors Q29a–j, each coupled at the collector with a corresponding source resistance R20a–j, and sink transistors Q30a–j, each coupled at the collector with a corresponding sink resistance R21a–j generating output voltage $V_{out}$.

Figure 5:
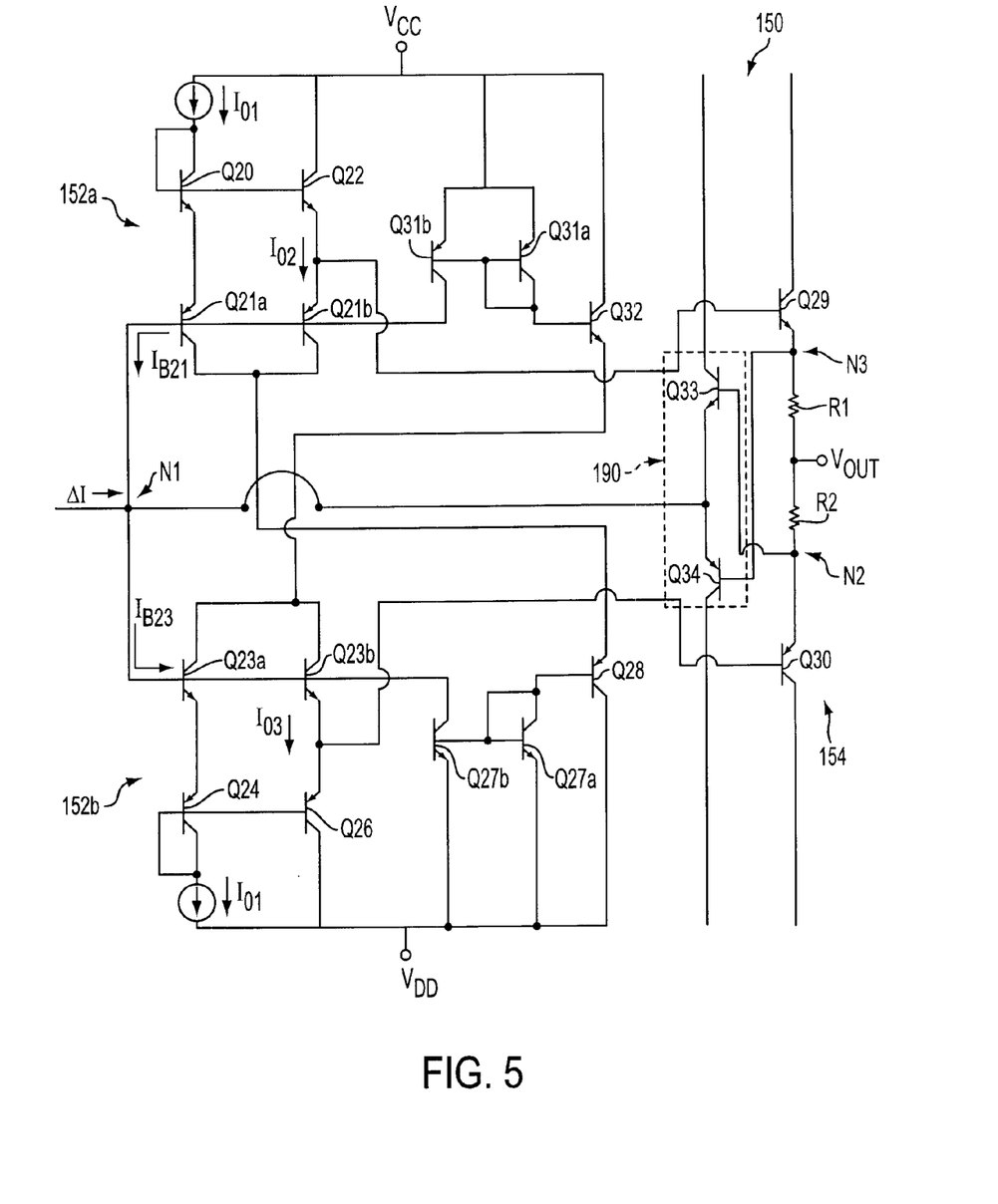
FIG. 5 is a schematic diagram of one embodiment of an output stage including a clamping stage.

FIG. 5 depicts a simplified schematic diagram of one implementation of one embodiment of the novel output stage 150 of the present invention. Output stage 150 includes a clamping stage 190 to prevent saturation of transistors of current driving stages 152a–b and other transistors associated with current driving stage 152a–b. Preventing current driving stage transistor saturation further prevents signal delays in propagating the output of amplifier input stage 120 to output circuit 154 caused by the time needed for the transistors to become unsaturated. Clamping stage 190 also provides further control of output stage 150 and enhances the gain of output stage 150. Clamping stage 190 prevents transistor saturation if the voltage at node N1 rapidly transitions high or transitions low by maintaining the voltage level of node N1 to a voltage which is proportional to output voltage $V_{out}$. In one embodiment, the voltage at node N1 is maintained to within one transistor base-emitter junction voltage drop $V_{BE}$.

In one embodiment, clamping stage 190 includes an NPN clamping source transistor Q33 and a PNP clamping sink transistor Q34. The collector of clamping source transistor Q33 couples with power source VCC and the emitter couples with node N1. The base of transistor Q33 couples with the emitter of output sink transistor Q30 at node N2 of output circuit 154. The emitter of clamping sink transistor Q34 couples with node N1 and the collector couples with VDD. The base of clamping sink transistor Q34 couples with the collector of output source transistor Q29 at node N3 of output circuit 154. Clamping stage 190 is activated when the voltage at node N1 varies from the voltage at either node N2 or node N3 by more than a predefined voltage, for example, by more than the base-emitter voltage drop $V_{BE}$ of transistor Q33 or Q34. This provides clamping of the output voltage of amplifier input stage 120 at node N1 with respect to the output voltage $V_{out}$. If the voltage at node N1 rapidly falls resulting in a one $V_{BE}$ drop at node N1 below the voltage at node N2, clamping source transistor Q33 will be activated maintaining the voltage at node N1 to within one $V_{BE}$ of output voltage $V_{out}$. If the voltage at node N1 rapidly rises to exceed the node voltage at node N3 by one $V_{BE}$, clamping sink transistor Q34 is activated limiting the voltage at N1 again to within one $V_{BE}$ of output voltage $V_{out}$.

Figure 6:
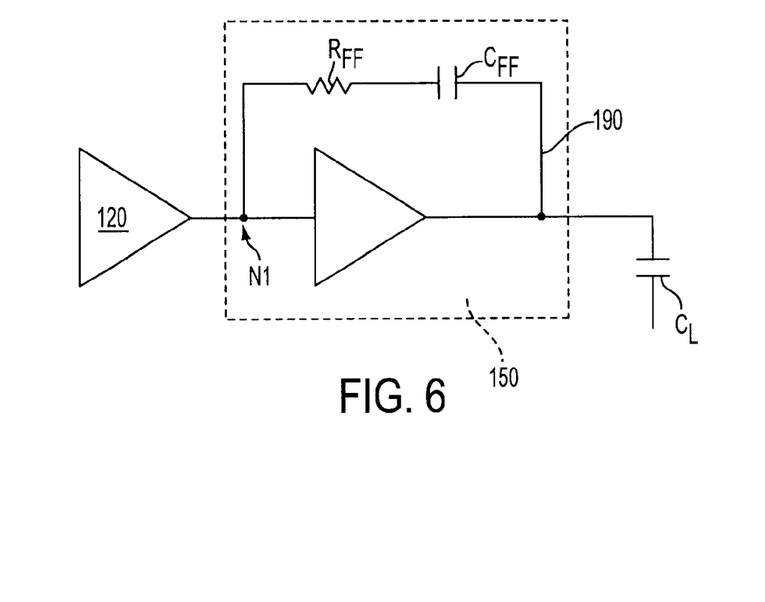
FIG. 6 depicts a simplified schematic diagram of one embodiment of an output stage of FIGS. 2 and 3, including the equivalent series RC feedforward path.

In one embodiment, the desired signal gain of output stage 150 is approximately equal to unity. However, as the frequency of the output signal from amplifier input stage 120 at node N1 increases the gain of output stage 150 may fall below unity. As the gain falls, capacitive loading effects will be reflected back through output stage 150 causing instability in the signal applied to the load and reducing the overall efficiency of output stage 150. To compensate for this instability, in one embodiment, output stage 150 of the present invention includes a feedforward path which improves the stability of the amplifier gain at higher frequencies. FIG. 6 depicts a simplified schematic diagram of the output stage 150, including the equivalent series RC feedforward path 210, coupled to amplifier 120 and a capacitive loading $C_L$. Feedforward path 210 includes an equivalent feedforward resistance $R_{FF}$ and an equivalent feedforward capacitance $C_{FF}$ coupled between node N1 and the output voltage $V_{out}$ of output stage 150. At higher frequencies, the effects of feedforward capacitance $C_{FF}$ are reduced thus maintaining the gain of output stage 150 at approximately unity and improving high frequency performance and stability of output stage 150.

Figure 7:
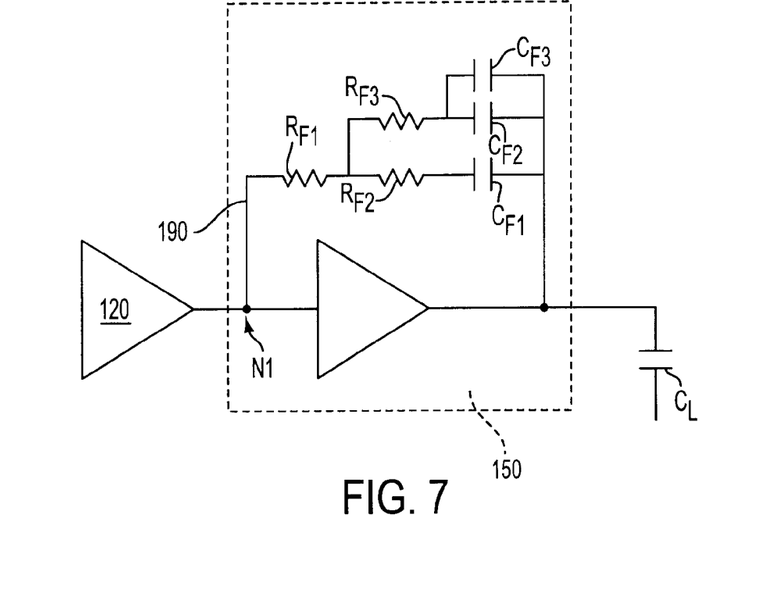
FIG. 7 depicts a simplified schematic diagram of one embodiment of the feedforward path of FIG. 6 implemented through an RC network.

In one embodiment, feedforward path 210 is implemented through an RC network depicted in FIG. 7. As shown, feedforward path 210 includes first feedforward resistor $R_{f1}$ which couples at one end to node N1 and at the other to second and third feedforward resistors $R_{f2}$ and $R_{f3}$. Second feedforward resistor $R_{f2}$ further couples with first feedforward capacitance $C_{f1}$. Third feedforward resistor $R_{f3}$ further couples with second and third feedforward capacitance $C_{f2}$ and $C_{f3}$ coupled in parallel. First, second and third feedforward capacitance $C_{f1}$, $C_{f2}$, $C_{f3}$, each couple with the output stage output voltage $V_{out}$. Thus, providing a bypass for the amplifier output at high frequencies or frequencies above a predefined limit and providing stability to the amplifier gain.

As taught by the foregoing description and examples, an output stage for substantially eliminating reflection current $\Delta I$ is provided by the present invention. The foregoing description of specific embodiments and examples of the invention have been presented for the purpose of illustration and description, and although the invention has been illustrated by certain of the preceding examples, it is not to be construed as being limited thereby. They are not intended to be exhaustive or to limit the invention to the precise forms disclosed, and obviously many modifications, embodiments, and variations are possible in light of the above teaching. It is intended that the scope of the invention encompass the generic area as herein disclosed, and by the claims appended hereto and their equivalents. The invention was described in relation to substantially eliminating reflection current into an amplifier, however, the output stage of the present invention is equally applicable to substantially any circuit adversely affected by reflection current.

Having disclosed exemplary embodiments and the best mode, modifications and variations may be made to the disclosed embodiments while remaining within the scope of the present invention as defined by the following claims.

What is claimed is:

1. An output stage configured to receive output from an input stage and to generate an output to a load, the output stage comprising:

an output circuit providing said output;

a first current driving stage having a first current gain, coupled between said input stage and said output circuit; said first current driving stage generating a first driving current for said output stage proportional to a product of said first current gain and a first bias current based on said output from said input stage;

a first current compensation circuit, coupled between said input stage and said first current driving stage, configured to compensate for said first bias current to limit reflection current back into the input stage;

a second current driving stage having a second current gain, coupled between said input stage and said output circuit; said second current driving stage generating a second driving current for said output stage proportional to product of said second current gain and a second bias current based on said output from said input stage;

wherein said first current gain and said second current gain can differ in magnitude; and a second current compensation circuit, coupled between said input stage and said second current driving stage, configured to compensate for said second bias current to limit reflection current back into the input stage.

2. The output stage of claim 1, wherein:

said first current driving stage is configured to drive said output circuit at a predefined level while limiting said first bias current; and said second current driving stage is configured to drive said output circuit at a predefined level while limiting said second bias current.

3. The output stage of claim 1, wherein:

said first current driving stage includes a first pair of current multiplying devices, wherein magnitude of said first bias current is further reduced as a result of increased overall current gain of said first current driving stage; and said second current driving stage includes a second pair of current multiplying devices, wherein magnitude of said second bias current is further reduced as a result of increased overall current gain of said second current driving stage.

4. The output stage of claim 1, wherein:

said first current compensation circuit includes a first current mirror coupled with said first current driving stage to compensate for said first bias current; and said second current compensation circuit includes a second current mirror coupled with said second current driving stage to compensate for said second bias current.

5. The output stage of claim 1, wherein:

said first current compensation circuit includes a first current mirror, coupled with said first current driving stage to compensate for said first bias current, said first current mirror comprising at least a first current control transistor and a first current mirror output transistor configured such that output current in said first current control transistor is mirrored as output current in said first current mirror output transistor; and said second current compensation circuit includes a second current mirror, coupled with said second current driving stage to compensate for said second bias current, said second current mirror comprising at least a second current control transistor and a second current mirror output transistor configured such that output current in said second current control transistor is mirrored as output current in said second current mirror output transistor.

6. The output stage of claim 1, wherein:

said first current compensation circuit includes a current-sinking transistor coupled to sink at least a portion of said first driving current generated by said first current driving stage.

7. The output stage of claim 1, wherein:

said second current compensation circuit includes a current-sourcing device coupled to source at least a portion of said second driving current generated by said second current driving stage.

8. A The output stage of claim 1, wherein:

said second current compensation circuit includes a current-sourcing device coupled to source at least a portion of said second driving current generated by said second current driving stage;

said first current compensation circuit includes a current-sinking device coupled to sink at least a portion of said first driving stage current generated by said first current driving stage, said current-sinking device configured to define a first compensation current to compensate for said first bias current; and said current-sourcing device configured to define a second compensation current to compensate for said second bias current.

9. The output stage of claim 8, wherein:

said current-sourcing device is an NPN transistor, and said current-sinking device is a PNP transistor.

10. The output stage of claim 9, wherein:

said first current compensation circuit includes a first current mirror, coupled with said PNP transistor and with said first current driving stage, configured to receive and mirror said first compensation current at said first current driving stage; and said second current compensation circuit includes a second current mirror, coupled with said NPN transistor and with said second current driving stage, configured to receive and mirror said second compensation current at said second current driving stage.

11. The output stage of claim 1, wherein:

said output circuit includes at least a first output current-sourcing device coupled with at least a first output current-sinking device;

an output of said output stage is defined between said first output current-sourcing device and said first output current-sinking device.

12. The output stage of claim 11, wherein:

said first output current-sourcing device is an NPN transistor; and said first output current-sinking device is a PNP transistor;

wherein a node defined by an emitter of said NPN transistor and an emitter of said PNP transistor defines said output of said output stage.

13. The output stage of claim 1, further including:

a clamping stage, coupled between an output of said input stage and an input of said output circuit, configured to maintain a magnitude of an output level of said output stage approximately equal to a magnitude of an output of said input stage.

14. The output stage of claim 13, wherein:

said clamping stage including a series-coupled current-sourcing transistor and current-sinking transistor.

15. The output stage of claim 1, further including:

a feedforward path, coupled between said output of said input stage and said output of said output stage, configured to stabilize said output stage output at high frequencies.

16. The output stage of claim 1, wherein:

said first current compensation circuit and said second current compensation circuit are configured to compensate for effect of temperature upon said output stage.

17. The output stage of claim 1, wherein:

said first current compensation circuit and said second current compensation circuit are configured to compensate for effect of process variation in fabricating said output stage.

18. An amplifier output stage configured to receive output from an input stage, the output stage comprising:

an output circuit that provides an output of said amplifier output stage;

a first current driving stage, coupled between an output of said input stage and said output circuit, configured to provide a first driving current to said output circuit;

a first current compensation circuit, coupled between said input stage and said first current driving stage, configured to compensate for a first bias current present at said output of said input stage so as to minimize reflection current back into said input stage;

a second current driving stage, coupled between an output of said input stage and said output circuit, configured to provide a second driving current to said output circuit;

a second current compensation circuit, coupled between said input stage and said second current driving stage, configured to compensate for a second bias current present at said output of said input stage so as to minimize reflection current back into said input stage.

19. The amplifier output stage of claim 18, wherein said output circuit includes:

at least one source transistor, coupled to receive said first driving current from said first current driving stage, to source current to an output of said amplifier output stage; and at least one sink transistor, coupled to receive said second driving current from said second current driving stage, to sink current from said output of said amplifier output stage.

20. The amplifier output stage of claim 18, wherein:

said first driving stage includes a first current multiplier coupled to provide sufficient current to said output circuit while reducing magnitude of said first bias current to reduce reflection current flow back into said output of said input stage; and said second driving stage includes a second current multiplier coupled to provide sufficient current to said output circuit while reducing magnitude of said second bias current to reduce reflection current blow back said output of said input stage.

21. An amplifier output stage configured to receive an output from an amplifier input stage and to generate an output to a load, the amplifier output stage comprising:

an output circuit from whence said output for a load is provided;

a first current driving stage, coupled between said input stage and said output circuit, configured to generate a first driving current for said output circuit proportional to a first bias current based on said output from said amplifier input stage;

said first current driving stage implemented with vertical PNP transistors and including a first current multiplier, coupled with said output circuit, configured to drive said output circuit at a predefined level while limiting magnitude of said first bias current;

a second current driving stage, coupled between said input stage and said output circuit, configured to generate a second driving current for said output circuit proportional to a second bias current based on said output from said amplifier input stage;

said second current driving stage including a second current multiplier, coupled with said output circuit, configured to drive said output circuit at a predefined level while limiting magnitude of said second bias current.

22. The amplifier output stage of claim 21, wherein:

said first current multiplier includes at least a first current multiplier transistor whose output provides a first drive current to said output circuit; and said second current multiplier includes at least a second current multiplier transistor whose output provides a second drive current to said output circuit.

23. An amplifier output stage configured to receive output from an amplifier input stage and to generate an output to a load, the amplifier output stage comprising:

a first current compensation circuit, coupled between said amplifier input stage and said amplifier output stage, configured to compensate for a first bias current to limit magnitude of reflect current back into said amplifier input stage;

said first current compensation circuit including a current-sinking device coupled to sink a first total drive current to a load coupled to said amplifier output stage;

a second current compensation circuit, coupled between said amplifier input stage and said amplifier output stage, configured to compensate for a second bias current to limit magnitude of reflect current back into said amplifier input stage;

said second current compensation circuit including a current-sourcing device coupled to source a second total drive current to said load.

24. The amplifier output stage of claim 23, wherein:

said current-sinking device includes a PNP transistor; and said current-sourcing device includes an NPN transistor.

25. The amplifier output stage of claim 23, wherein:

said first current compensation circuit includes a first current mirror to compensate for said first bias current; and said second current compensation circuit includes a second current mirror to compensate for said second bias current.

26. The amplifier output stage of claim 23, wherein:

said first current compensation circuit includes a first current mirror to compensate for said first bias current, said first current mirror including at least a first current control device and a first current mirror output device and configured such that a current in said first current control device is mirrored in said first current mirror output device to provide compensation for said first bias current;

said second current compensation circuit includes a second current mirror to compensate for said second bias current, said second current mirror including at least a second current control device and a second current mirror output device and configured such that a current in said second current control device is mirrored in said second current mirror output device to provide compensation for said second bias current.

27. A method to enhance output gain of an amplifier output stage, the method comprising the following steps:

receiving as a driving current an output from an amplifier input stage;

multiplying magnitude of received said driving current;

coupling multiplied said driving current as input to said output stage; and reducing reflection current into said output of said amplifier input stage proportional to magnitude of multiplication of received said driving current;

wherein output of said amplifier output stage is stabilized.

28. The method of claim 27, further including compensating for a bias current that is proportional to an output from said amplifier input stage.

29. The method of claim 27, further including generating at least one compensation current to compensate for a bias current that is proportional to an output from said amplifier input stage.

30. The method of claim 27, further including reducing magnitude of said driving current required to provide a stable output from said amplifier output stage;

wherein reduction of magnitude of said driving current is proportional to a factor by which received said driving current is multiplied.

31. The method of claim 27, at least the steps of receiving and multiplying are carried out using at least one PNP transistor and at least one NPN transistor, the method further including:

generating, to compensate for a bias current that is proportional to an output from said amplifier input stage, at least a first first compensation current that compensates for a current gain factor of said PNP transistor, and generating at least a second compensation current that compensates for a current gain factor of said NPN transistor;

wherein compensation is provided to account for a mismatch between current gain of said PNP transistor and current gain of said NPN.

32. The method of claim 27, further including:

feedforwarding, at frequencies above a predefined frequency limit, output from said amplifier input stage to output of said amplifier output stage.

33. The method of claim 27, further including:

clamping output of said amplifier output stage if divergence between magnitude of said output of said amplifier output stage and output from said amplifier input stage exceeds a predefined limit.

34. The method of claim 27, further including:

reducing quiescent current required to maintain said output stage in an active state without adversely affecting magnitude of an output voltage appearing at said output stage.

35. The method of claim 27, further including:

reducing quiescent current required to maintain said output stage in an active state without adversely affecting magnitude of an output voltage appearing at said output stage;

wherein said reducing quiescent current includes at least one of (a) reducing at least one bias current, and (b) multiplying driving current to maintain magnitude of said output voltage.

36. The method of claim 27, further including using current mirror techniques to compensate for a bias current that is proportional to an output from said amplifier input stage.

* * * * *